(12) United States Patent
Srinivasan et al.

(10) Patent No.: US 11,944,023 B2
(45) Date of Patent: Mar. 26, 2024

(54) NON-VOLATILE RESISTIVE RANDOM ACCESS MEMORY AND A MANUFACTURING METHOD

(71) Applicant: University of South Africa, Pretoria (ZA)

(72) Inventors: Ananthakrishnan Srinivasan, Johannesburg (ZA); Sreedevi Vallabhapurapu, Johannesburg (ZA); Vijaya Srinivasu Vallabhapurapu, Johannesburg (ZA)

(73) Assignee: University of South Africa, Pretoria (ZA)

( * ) Notice: Subject to any disclaimer, the term of this patent is extended or adjusted under 35 U.S.C. 154(b) by 379 days.

(21) Appl. No.: 17/296,826

(22) PCT Filed: Nov. 26, 2019

(86) PCT No.: PCT/IB2019/060168
§ 371 (c)(1),
(2) Date: May 25, 2021

(87) PCT Pub. No.: WO2020/109991
PCT Pub. Date: Jun. 4, 2020

(65) Prior Publication Data
US 2021/0399218 A1    Dec. 23, 2021

(30) Foreign Application Priority Data
Nov. 27, 2018   (ZA) .................................. 2018/08000

(51) Int. Cl.
H10N 70/00     (2023.01)
H10B 63/00     (2023.01)
H10N 70/20     (2023.01)

(52) U.S. Cl.
CPC ......... H10N 70/8833 (2023.02); H10B 63/22 (2023.02); H10N 70/021 (2023.02); H10N 70/24 (2023.02); H10N 70/841 (2023.02)

(58) Field of Classification Search
CPC ............. H10N 70/883; H10N 70/8833; H10N 70/021; H10B 63/22; G11C 11/5685
See application file for complete search history.

(56) References Cited

U.S. PATENT DOCUMENTS 8,852,996 B2   10/2014  Wang et al.
8,912,518 B2   12/2014  Chi et al.
(Continued)

FOREIGN PATENT DOCUMENTS

CN       101621114 A      1/2010
CN       108831993 A     11/2018
(Continued)

OTHER PUBLICATIONS

Hyeongwoo Yu et al., Al-Doped ZnO as a Switching Layer for Transparent Bipolar Resistive Switching Memory, Electron Mater Lett., vol. 10 (2), pp. 321-324 (2014).
(Continued)

*Primary Examiner* — David A Zarneke
(74) *Attorney, Agent, or Firm* — Womble Bond Dickinson (US) LLP

(57) ABSTRACT

The invention relates to a non-volatile resistive random access memory (ReRAM), a non-volatile ReRAM composition and to a method for manufacturing a non-volatile non-volatile ReRAM. The ReRAM includes a first electrode, a second electrode and a resistive switching/active layer which is located between the first and second electrodes. The switching layer contains chitosan and aluminium doped/incorporated zinc oxide. The switching/active layer may be configured to perform a switching operation accord-
(Continued)

ing to an applied voltage. The switching/active layer may be in the form of a film. The switching/active layer may be coated/applied onto the first electrode and the second electrode may be placed/applied/provided over the switching/active layer such that the switching/active layer is located/wedged in-between the two electrodes.

19 Claims, 1 Drawing Sheet

(56) References Cited

U.S. PATENT DOCUMENTS

| | | | |
|---|---|---|---|
| 8,933,428 | B2 | 1/2015 | Mieno et al. |
| 8,933,429 | B2 | 1/2015 | Ananthan et al. |
| 9,620,205 | B2 | 4/2017 | Nardi et al. |
| 2007/0215977 | A1 | 9/2007 | Lee et al. |
| 2007/0224760 | A1 | 9/2007 | Matsui et al. |
| 2008/0251816 | A1 | 10/2008 | Tanaka et al. |
| 2013/0056665 | A1 | 3/2013 | Nimberger |
| 2013/0062587 | A1 | 3/2013 | Lee et al. |
| 2014/0124725 | A1 | 5/2014 | Chi et al. |
| 2015/0129826 | A1 | 5/2015 | Wang |
| 2018/0090207 | A1 | 3/2018 | Hou et al. |

FOREIGN PATENT DOCUMENTS

| | | |
|---|---|---|
| JP | 2014096542 A | 5/2014 |
| KR | 20070092503 A | 9/2007 |
| KR | 10-2016-0118848 A | 10/2016 |
| KR | 10-2017-0011709 | 1/2017 |
| WO | WO-2012112769 A1 | 8/2012 |

OTHER PUBLICATIONS

Seung-Won Yeom et al., Transparent Resistive Switching Memory Using Aluminium Oxide on a Flexible Substrate, Nanotechnology, vol. 27, No. 7, pp. 1-7, Jan. 14, 2016.
Dongsoo Lee et al., Resistance Switching of Al doped ZnO for Non Volatile Memory Applications, 2006 21st IEEE Non-Volatile Semiconductor Memory Workshop, Feb. 12-16, 2006.
Won-Ho Lee et al., Multilevel Resistive-Change Memory Operation of Al-Doped ZnO Thin-Film Transistor, IEEE Electron Device Letters, vol. 37, No. 8, pp. 1014-1017, Aug. 2016.
Firman Mangasa Simanjuntak et al., Enhancing the Memory Window of AZO/ZnO/ITO Transparent Resistive Switching Devices by Modulating the Oxygen Vacancy Concentration of the Top Electrode, Journal of Material Science, vol. 5, pp. 6961-6969 (2015).
Niloufar Raeis Hosseini et al., Resistive Switching Memory Based on Bio-Inspired Natural Solid Polymer Electrolytes, ACS Nano, 9(1), pp. 419-426 (2015).
Yu-Chi Chang et al., Resistive Switching Behavior in Gelatin Thin Films for Nonvolatile Memory Application, ACS Applied Materials & Interfaces, vol. 6, pp. 5413-5421 (2014).
Mrinal K. Hota et al., A Natural Silk Fibroin Protein-Based Transparent Bio-Memristor, Advanced Functional Materials, vol. 22, pp. 4493-4499 (2012).
Umberto Celano et al., All-Nanocellulose Non-Volatile Resistive Memory, NPG Asia Materials 8(e310), pp. 1-7 (2016).
Indian Office Action issued in connection with corresponding Indian Application No. 202117019768 dated Jan. 18, 2023.
Simanjuntak, F. M. et al. "Status and Prospects of ZnO-Based Resistive Switching Memory Devices", *Nanoscale Research Letters* (2016) 11:368—DOI 10.1186/s11671-016-1570-y.
International Search Report dated Mar. 3, 2020 issued in International Application (No. PCT/IB2019/060168).
Written Opinion dated Mar. 3, 2020 issued in International Application (No. PCT/IB2019/060168).
Extended European Search Report dated Jun. 2, 2023.
Chinese Office Action and Search Report dated Sep. 6, 2023 (in Chinese and the English translations thereof).
Niloufar Raeis Hosseini et al., Resistive switching memory using biomaterials, J Electroceram, 39:223-238 (2017).

NON-VOLATILE RESISTIVE RANDOM ACCESS MEMORY AND A MANUFACTURING METHOD

RELATED APPLICATIONS

This is a 35 USC 371 U.S. National Phase of International Application No. PCT/IB2019/060168 filed Nov. 26, 2019, and published as WO 2020/109991 on Jun. 4, 2020. Priority is claimed to South African Application No2018/08000 filed Nov. 27, 2018. The contents of the aforementioned applications are incorporated by reference in their entirety.

BACKGROUND OF THE INVENTION

THIS invention relates to a non-volatile resistive random access memory (ReRAM), as well as to a method of manufacturing a non-volatile resistive random access memory.

U.S. Ser. No. 13/974,278 states that selector devices suitable for memory device applications should have low leakage currents at low voltages to reduce sneak current paths for non-selected devices and high leakage currents at high voltages to minimize voltage drops during switching. The document describes a memory selector with multilayers in which first and fifth layers are electrodes. The electrode materials selected are TiN, TaN, Pt or Ru. Second and fourth layers are ZrOx, HfOx and AlOx containing N,C, B, Si, Ta and Zr as dopants. The third layer is made of either TiOx or TaOx. In this memory device, all the materials used are inorganic.

U.S. Ser. No. 15/206,076 describes a method of manufacturing a resistive switching element. The memory device has a cross point cell structure with pillar-like features using multilayers of inorganic materials such as $SiO_2$ and SiN. This device however has a complicated memory element structure and is completely made up of inorganic materials.

U.S. Pat. No. 8,852,996 relates to carbon doped resistive switching layers, resistive random access memory (ReRAM) cells including these layers, as well as methods of forming thereof. The memory cell structure has two layers of carbon doped metal oxides like $AlO_2$, $HfO_2$, Zirconium Oxide. The ON/OFF ratio reported is however quite low. The materials used in this work are also all inorganic.

U.S. Pat. No. 8,912,518B2 relates to semiconductor devices, such as resistive random access memory (ReRAM) cells, that include current limiting layers formed from doped metal oxides and/or nitrides. The memory cell has multilayers where heat treatment was performed for disposing active layers on electrodes. Inorganic materials such as TiN, Nb:$TiO_2$, and Al:ZnO are used as active layers. $I_{ON}$ and $I_{OFF}$ currents have a difference of at least five times. In some of the examples, the difference is merely $10^1$. The forming voltage is 7 V. This cell structure does not use biomaterial and is hence not biodegradable. Heat treatment is also involved. The ON/OFF ratio reported is also low.

Hyeongwoo Yu, Minho Kim, Yoonsu Kim, Jeongsup Lee, Kyoung-Kook Kim, Sang-Jun Choi, and Soohaeng Cho; Al Doped ZnO as a Switching Layer for Transparent Bipolar Resistive Switching Memory. Electron. Mater. Lett., Vol. 10, No. 2 (2014), pp. 321-32: In this paper, an Al-doped ZnO (AZO) layer is provided as a resistive switching layer for transparent resistive switching random access memory devices. An Indium-Tin-Oxide (ITO)/AZO/ITO/glass device exhibits a transmittance of ~80% (including a glass substrate) in the visible wavelength region and demonstrates reliable bipolar resistive switching behavior over d.c. 300 sweeping cycles with a low operation voltage and a very low variation in the switching threshold voltage. The paper suggests that AZO can be used as a film for ReRAM. However, they say that further study is needed for performance and reliability of the device as the ON/OFF ratio is just 1 order of magnitude.

Seung-Won Yeom, Sang-Chul Shin, Tan-Young Kim, Hyeon Jun Ha, Yun-Hi Lee, Jae Won Shim and Byeong-Kwon Ju; Transparent Resistive Switching Memory using Aluminium Oxide on a Flexible Substrate. Nanotechnology, Volume 7, Number 7, 14 Jan. 2016. In this paper, $Al_2O_3$-based ReRAM with transparent indium-zinc-oxide (IZO) electrodes was fabricated on a flexible substrate. The device transmittance was found to be higher than 80% in the visible region (400-800 nm). Bended states (radius=10 mm) of the device also did not affect the memory performance because of the flexibility of the two transparent IZO electrodes and the thin $Al_2O_3$ layer. The conduction mechanism of the resistive switching device was explained by ohmic conduction and a Poole-Frenkel emission model. The reported ON/OFF ratio is only 3 orders of magnitude, which is very low.

Dongsoo Lee; Dae-Kue Hwang; Man Chang; Yunik Son; Dong-jun Seong; Dooho Choi and Hyunsang Hwang; Resistance switching of Al doped ZnO for nonvolatile applications. 2006 21st IEEE Non-Volatile Semiconductor Memory Workshop; 12-16 Feb. 2006: This paper investigates the resistance switching characteristics of non-stoichiometric oxides and doped ZnO for nonvolatile memory applications. Even though the nonstoichiometric materials, such as ZrOx and STOx, have good resistive switching behaviours, the device yield is not sufficient for memory application. The memory behaviour showed bistability with ON/OFF ratio of greater than 2 orders of magnitude which is very low. The devices reported are also entirely inorganic with no biodegradable content.

Won-Ho Lee; Eom-Ji Kim; Sung-Min Yoon; Multilevel resistance change memory operation of AlZnO thin film transistor. IEEE Electron Device Letters (Volume: 37, Issue: 8, August 2016). In this paper, a multilevel resistive-change memory device with thin-film transistor (TFT) structure is proposed, in which both functions of transistor and nonvolatile memory can be performed. Al-doped ZnO was employed for the active channel of the TFT as well as for the resistive-change material of the memory device. This paper however shows an on/off ratio for nonvolatile memory application as $10^2$, which is again very low.

Mangasa, Firman & Panda, Debashis & Tsai, Tsung-Ling & Lin, Chun-An & Wei, Kung-Hwa & Tseng, Tseung-Yuen. (2015). Enhancing the memory window of AZO/ZnO/ITO transparent resistive switching devices by modulating the oxygen vacancy concentration of the top electrode. Journal of Materials Science. 50. 1-9. 10.1007/s10853-015-9247-y. The effect of a defect concentration-modified top electrode on the bipolar resistance switching of transparent Al-doped ZnO/ZnO/ITO [AZO(TE)/ZnO/ITO(BE)] devices was investigated. The device is entirely inorganic with a low on/off ratio of ~$10^2$.

Hosseini, N. R.; J. S. Lee. Resistive Switching Memory Based on Bioinspired Natural Solid Polymer Electrolytes. ACS Nano, 2015, 9(1), 419-426. In this paper, a solution processed chitosan based resistive switching memory device is demonstrated with Platinum electrode/Ag doped chitosan active layer/Ag electrode structure. The memory device showed reproducible and reliable bipolar resistive switching characteristics. The memory device based on chitosan as a natural solid polymer electrolyte could be switched reproducibly between high and low resistance states. The transparent Ag embedded chitosan film showed acceptable and comparable resistive switching behaviour on the flexible plastic substrate as well. In this paper, the authors have tested the chitosan memory by doping silver nitrate and observed on/off ratio of ~$10^5$ was obtained. A high concentration of metallic silver was used for fabricating the device.

Chang, Y. C.; Wang, Y. H. Resistive switching behavior in gelatin thin films for nonvolatile memory application. ACS Applied Materials & Interfaces, 2014, 6(8), 5413-5421. This paper shows a device fabricated with biodegradable type B gelatin as active layer. The fabricated devices were baked at 50° C. to obtain a high on/off ratio of ~$10^6$, but data in the paper shows an on/off ratio of only ~$10^5$.

Hota, M. K.; Bera, M. K.; Kundu, B.; Kundu, S. C.; Maiti, C. K. A Natural Silk Fibroin Protein-Based Transparent Bio-Memristor. Advanced Functional Materials, 22(21), 4493-4499. As a proof-of-concept, the chemical process to realize ultra-lightweight and biocompatible resistive switching memory devices based on natural silk protein films is presented. The resistive switching memory based on silk protein has an on/off ratio of $10^5$. In addition, it is demonstrated that the ultra-lightweight memory devices have potential for cross-bar array memory system application. The authors in this paper have used silicon substrates with gold coating and then drop cast silk fibroin solution as active layer.

Celano, U.; Nagashima, K.; Koga, H.; Nagi, M.; Zhuge, F.; Meng, G.; He, Y.; Boeck, J. D; Jurczak, M.; Vandervorst, W.; Yanagida, T. All-nanocellulose non-volatile resistive memory. NPG Asia materials 2016, 8, e310. An environmentally friendly, disposable non-volatile memory device composed of 99.3 vol. % nanocellulose is demonstrated in this work. The preparation of the substrate and active layer however involves complicated chemistry.

The Inventors wish to provide a non-volatile random access memory (RAM) which is both environmentally friendly and has a high on/off switching ratio.

SUMMARY OF THE INVENTION

In accordance with a first aspect of the invention there is provided a non-volatile resistive random access memory (ReRAM) which includes:
a first electrode;
a second electrode; and
a resistive switching/active layer which is located between the first and second electrodes, wherein the switching layer contains
chitosan, and
aluminium doped/incorporated zinc oxide.

The term "contains" should be interpreted to include the possibility of additional, unnamed elements. In other words the switching layer may include other elements in addition to chitosan and aluminium doped/incorporated Zinc Oxide.

The resistive random access memory may be a resistive random access memory module.

The switching/active layer may for a dielectric of the ReRAM.

The switching/active layer may be configured to perform a switching operation (i.e. switching between high and low resistive states) according to an applied voltage.

The switching/active layer may be in the form of a film (e.g. a thin film).

The switching/active layer may be coated/applied onto the first electrode. The second electrode may be placed/applied/provided over the switching/active layer such that the switching/active layer is located/wedged in-between the two electrodes (e.g. as shown in FIG. 1).

The first electrode may be made, at least partially, from indium tin oxide. The first electrode may be coated/provided on a glass substrate. The glass substrate may therefore form part of the ReRAM. The first electrode may be made from indium tin oxide which is coated/provided on the glass substrate.

The second electrode may be made, at least partially, from a metal such as titanium, silver, aluminium etc. The second electrode may therefore be a metal electrode.

In accordance with a second aspect of the invention there is provided a non-volatile resistive random access memory (ReRAM) switching layer composition which includes:
chitosan, and
aluminium doped/incorporated Zinc Oxide.

In accordance with a third aspect of the invention there is provided a method for manufacturing a non-volatile resistive random access memory (ReRAM), wherein the method includes:
providing a switching layer between a first electrode and a second electrode, wherein the switching layer contains chitosan and aluminium doped/incorporated zinc oxide.

The method may more specifically include coating the switching layer onto the first electrode. Even more specifically, the method may include coating the switching layer onto a substrate on which the first electrode is formed/provided. The coating may be spin coating. The first electrode may be made, at least partially, from indium tin oxide. The first electrode may therefore be indium tin oxide which is coated/provided on the glass substrate. The second electrode may be made, at least partially, from metal such as titanium, silver or aluminium. The second electrode may therefore be a metal electrode.

The substrate may be a glass substrate.

The method may include preparing/making the switching layer by preparing a chitosan solution. The step of preparing/making the switching layer may further include adding aluminium doped zinc oxide nanoparticles to the chitosan solution. The step of preparing/making the switching layer may then further include spin coating a layer of the solution onto the substrate in order to form the switching layer over the first electrode which is provided on the substrate.

In accordance with a fourth aspect of the invention there is provided a non-volatile resistive random access memory (ReRAM) module/device which includes the non-volatile resistive random access memory (ReRAM) in accordance with the first aspect of the invention.

In accordance with a fifth aspect of the invention there is provided a non-volatile resistive random access memory (ReRAM) module/device which includes the non-volatile resistive random access memory (ReRAM) switching layer composition in accordance with the second aspect of the invention.

In accordance with a sixth aspect of the invention there is provided a method for manufacturing a non-volatile resistive random access memory (ReRAM) module/device, wherein the method includes:
providing a switching layer between a first electrode and a second electrode, wherein the switching layer contains chitosan and aluminium doped/incorporated zinc oxide.

The method may include any one or more of the method steps mentioned above in relation to the method in accordance with the third aspect of the invention.

BRIEF DESCRIPTION OF THE DRAWINGS

The invention will now be described, by way of example, with reference to the accompanying drawings. In the drawings.

DESCRIPTION OF PREFERRED EMBODIMENTS

Figure 1:
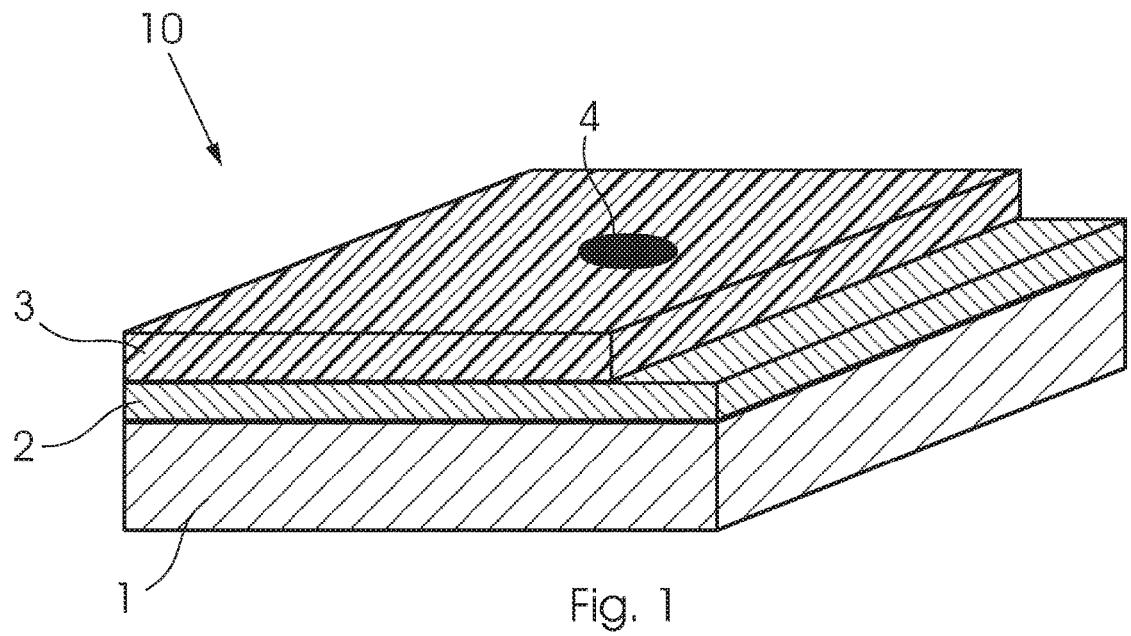
FIG. 1 shows a schematic diagram of a non-volatile random access memory (RAM), in the form of a resistive RAM (ReRAM), in accordance with the invention.

The present invention relates to a non-volatile random access memory, more specifically resistive random access memory (ReRAM) (generally indicated by reference numeral 10). In one example, the ReRAM 10, in accordance with the invention, may include a first, bottom electrode 2, a switching/active layer 3 which is coated on top of the bottom electrode 2, and a second, top electrode 4 which is placed/deposited over the switching/active layer 3 so that the switching/active layer 3 is located in-between the two electrodes 2, 4. Reference is in this regard made to FIG. 1 which represents a commonly used two-terminal sandwich configuration of a ReRAM.

The bottom electrode 2 is typically formed/coated on a glass substrate 1. More specifically, indium tin oxide (ITO) is typically coated onto a glass substrate 1, in order to form the bottom electrode 2. The top electrode 4 is typically made of a metal such as titanium, silver or aluminium.

The switching/active layer 3 is typically configured to perform a switching operation by changing a resistance between the electrodes 2, 4, according to an applied voltage.

The switching/active layer 3 contains/includes chitosan (which is a biodegradable polymer) and aluminium (Al) incorporated/doped zinc oxide (ZnO). Zinc oxide is also environmentally friendly and bio-compatible. The switching/active layer 3 is typically prepared in solution and then spin coated onto an indium tin oxide coated glass substrate 1 (i.e. over the bottom electrode 2), in order to form a thin film (or layer) over the bottom electrode 2. The switching/active layer 3 therefore has/incorporates Al doped ZnO nano particles and chitosan, which is typically spin coated onto the substrate 1 (over the bottom electrode 2).

The top electrode is then placed/deposited onto the film 3.

Through experimentation, the Inventors found that the ReRAM 10 in accordance with the invention can have a remarkably high electrical switching behaviour from a high resistance state to a low resistance state, and vice versa (i.e. the high switching behaviour is reversible). More specifically, an on/off ratio of more than seven orders in the current versus voltage characteristics has been observed. Reference is in this regard made to the following example experiment:

Experiment

Figure 2:
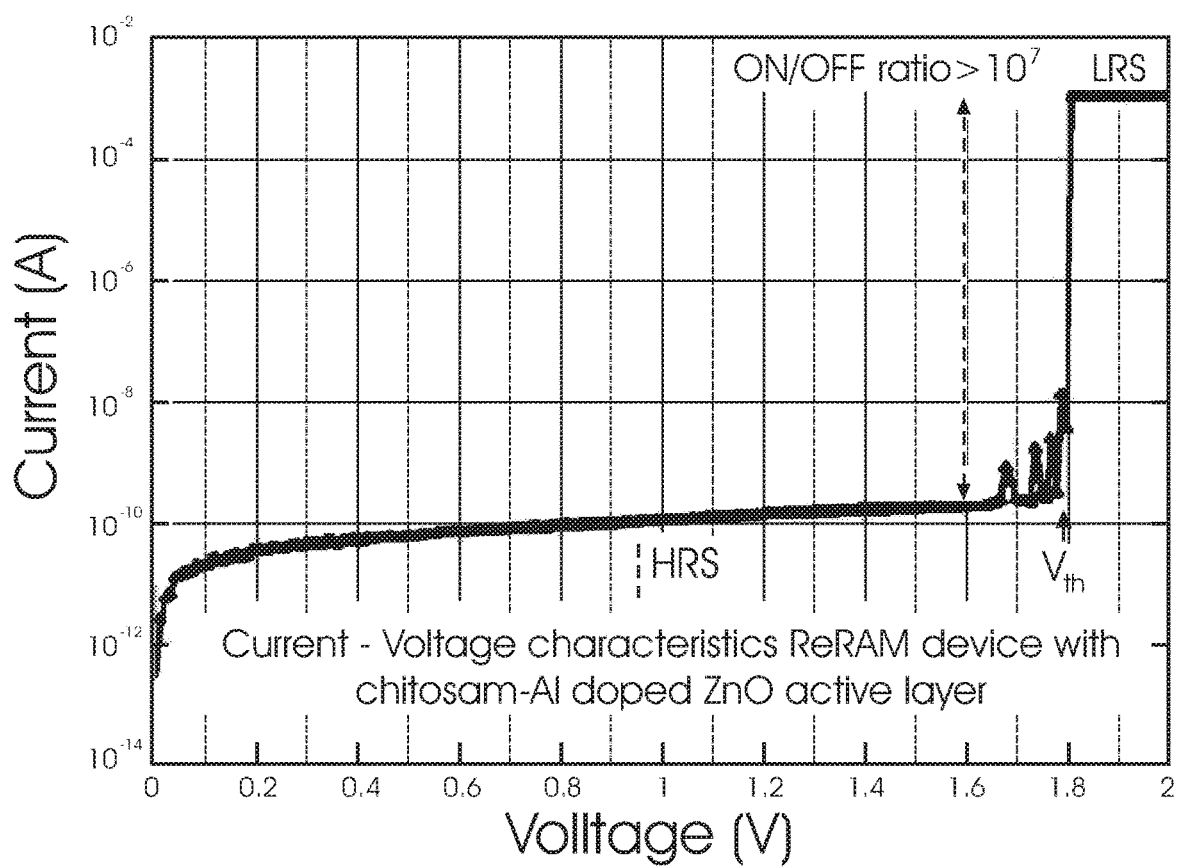
FIG. 2 shows a graphical illustration of I-V characteristics of the ReRAM in FIG. 1.

1. In this experiment, a biodegradable, biocompatible ReRAM 10 was fabricated with a two terminal ReRAM cell structure consisting of a metal top electrode 4, a switching/active layer 3 containing chitosan and aluminium doped zinc oxide nanoparticles, and an indium tin oxide (ITO) bottom electrode 2 provided on a glass substrate 1.
2. In this experiment, an ITO coated glass plate/substrate was used (e.g. purchased from Sigma-Aldrich). The plate was pre-cleaned in an ultrasonic bath with acetone for five minutes, followed by isopropylalcohol for 5 minutes and then with distilled water for five minutes, respectively.
3. Course flakes of chitosan with high molecular weight (310,000-375,000 Da) (e.g. purchased from Sigma-Aldrich) was used to prepare an aqueous 1 wt. % chitosan solution (in which 1% acetic acid was added to induce complete dissolution of chitosan).
4. The chitosan solution was continuously stirred for 24 hours using a magnetic stirrer at room temperature to completely dissolve chitosan flakes in distilled water.
5. Aluminium doped zinc oxide nanoparticles, with sizes ranging from 20 nm-30 nm, were prepared by chemical pyrophoric method as explained in J. Das, D. K. Mishra and V. V. Srinivasu, *Journal of Alloys and Compounds* 704 (2017) 37. Aluminium doping was varied to obtain $Al_{0.01}Zn_{0.99}O$, $Al_{0.02}Zn_{0.98}O$ and $Al_{0.03}Zn_{0.97}O$ nanoparticles which were designated as A2, A4 and A6, respectively.
6. The aluminium doped zinc oxide nanoparticles were added to the chitosan solution in order to prepare solutions of chitosan and aluminium doped zinc oxide with different concentrations.
7. The chitosan-aluminium doped zinc oxide solutions were then spin coated on the pre-cleaned ITO substrate (see step 2 above), using a known spin coating technique at a speed of 500 rpm for 30 seconds. This yielded a thin layer/film of the solutions over the ITO substrate, which serves as the bottom electrode 2.
8. The spin coated film was then dried at 60° C. for one hour in order to remove excess solvent from the film.
9. A 2 mm size titanium top electrode 14 was then deposited on the film by a DC magnetron stuttering technique. This technique is well known and will therefore not be described in more detail.
10. Current-voltage (I-V) characteristics of the fabricated ReRAM cells were measured. In these measurements, voltage was slowly varied from 0 V and the corresponding current flowing through the ReRAM was measured. These ReRAM cells exhibited low current until a threshold voltage was reached. At the threshold voltage ($V_{th}$), the current suddenly jumped to high values and remained at this high current value for further increase in voltage. Such a phenomenon is characteristic of a resistive switching ReRAM and the ratio of the current values before and after switching is termed as the on/off ratio. Of the ReRAM sells fabricated/manufactured, the best results in on/off ratio, in excess of (>) $10^7$, was obtained with the film containing $Al_xZn_{1-x}O$ nanoparticles with varying x of Al. Reference is in this regard made to FIG. 2 which provides a graphical illustration of the I-V characteristics of the manufactured ReRAM. From this figure, it will be noted that the on/off ratio is in excess of (>) $10^7$ (obtained for the optimized doping of Al (x=0.02) and a 10 weight % of $Al_xZn_{1-x}O$ in Chitosan). As illustrated in FIG. 2, switching occurred at about 1.8V (i.e. $V_{th}$=1.8V).

From the above, it will be noted that the present invention provides a ReRAM with extremely high switching capabilities (i.e. an on/off ratio in excess of $10^7$). The active layer is also biodegradable since its main content is chitosan and the ReRAM can therefore be seen as being environmentally friendly (i.e. a "green memory device").

The invention therefore provides an Aluminium doped Zinc Oxide (Al:ZnO) incorporated Chitosan active layer for high performance and biodegradable non-volatile resistive random access memory (ReRAM).

The invention claimed is:

1. A non-volatile resistive random access memory (ReRAM) which includes:
   a first electrode;
   a second electrode; and
   a resistive switching/active layer which is located between the first and second electrodes, wherein the switching layer contains
   chitosan, and
   aluminium doped/incorporated zinc oxide.

2. The ReRAM of claim 1, wherein the switching/active layer is configured to perform a switching operation according to an applied voltage.

3. The ReRAM of claim 1, wherein the switching/active layer is in the form of a film.

4. The ReRAM of claim 1, wherein the switching/active layer is coated/applied onto the first electrode and the second electrode is placed/applied/provided over the switching/active layer such that the switching/active layer is located/wedged in-between the two electrodes.

5. The ReRAM of claim 4, wherein the first electrode is made, at least partially, from indium tin oxide.

6. The ReRAM of claim 5, wherein the ReRAM includes a glass substrate, and wherein the first electrode is coated/provided on the glass substrate.

7. The ReRAM of claim 6, wherein the first electrode is made from indium tin oxide which is coated/provided on the glass substrate.

8. The ReRAM of claim 7, wherein the second electrode is made, at least partially, from a metal.

9. A non-volatile resistive random access memory (ReRAM) switching layer composition which includes:
   chitosan, and
   aluminium doped/incorporated Zinc Oxide.

10. A method for manufacturing a non-volatile resistive random access memory (ReRAM), wherein the method includes:
    providing a switching layer between a first electrode and a second electrode, wherein the switching layer contains chitosan and aluminium doped/incorporated zinc oxide.

11. The method of claim 10 which includes coating the switching layer onto the first electrode.

12. The method of claim 10 which includes coating the switching layer onto a substrate on which the first electrode is formed/provided.

13. The method of claim 12, wherein the coating step includes spin coating the switching layer onto the substrate.

14. The method of claim 13, wherein the first electrode is made, at least partially, from indium tin oxide.

15. The method of claim 14, wherein the second electrode is made, at least partially, from a metal.

16. The method of claim 13, wherein the substrate is a glass substrate.

17. The method of claim 16 which includes preparing/making the switching layer by preparing a chitosan solution.

18. The method of claim 17, wherein the step of preparing/making the switching layer includes adding aluminium doped zinc oxide nanoparticles to the chitosan solution.

19. The method of claim 18, wherein the step of preparing/making the switching layer further includes spin coating a layer of the solution onto the substrate in order to form the switching layer over the first electrode which is provided on the substrate.

* * * * *